US010388758B2

(12) United States Patent
Liao et al.

(10) Patent No.: US 10,388,758 B2
(45) Date of Patent: Aug. 20, 2019

(54) SEMICONDUCTOR STRUCTURE HAVING A HIGH VOLTAGE WELL REGION

(71) Applicant: Vanguard International Semiconductor Corporation, Hsinchu (TW)

(72) Inventors: Chih-Cherng Liao, Hsinchu County (TW); Manoj Kumar, Jharkhand (IN); Chia-Hao Lee, New Taipei (TW); Chung-Te Chou, Hsinchu (TW); Ya-Han Liang, Taoyuan (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 15/876,429

(22) Filed: Jan. 22, 2018

(65) Prior Publication Data

US 2019/0229206 A1 Jul. 25, 2019

(51) Int. Cl.
| H01L 29/66 | (2006.01) |
| H01L 29/10 | (2006.01) |
| H01L 29/78 | (2006.01) |
| H01L 21/265 | (2006.01) |
| H01L 29/423 | (2006.01) |

(52) U.S. Cl.
CPC ...... *H01L 29/66704* (2013.01); *H01L 21/265* (2013.01); *H01L 29/1095* (2013.01); *H01L 29/4236* (2013.01); *H01L 29/7825* (2013.01)

(58) Field of Classification Search
CPC .......... H01L 29/66704; H01L 29/1095; H01L 29/4236; H01L 29/7825
See application file for complete search history.

(56) References Cited

U.S. PATENT DOCUMENTS

| 5,233,215 A * | 8/1993 | Baliga | H01L 29/0619 257/490 |
| 5,693,569 A * | 12/1997 | Ueno | H01L 29/41766 438/270 |
| 5,963,807 A * | 10/1999 | Ueno | H01L 29/0623 438/268 |
| 2010/0140687 A1* | 6/2010 | Chu | H01L 29/4236 257/328 |

(Continued)

FOREIGN PATENT DOCUMENTS

| KR | 20020051532 A * | 6/2002 |
| KR | 20040003115 A * | 1/2004 |

(Continued)

*Primary Examiner* — Ida M Soward
(74) *Attorney, Agent, or Firm* — Birch, Stewart, Kolasch & Birch, LLP

(57) ABSTRACT

A method for fabricating a semiconductor structure includes providing a substrate. The method further includes implanting the substrate to form a high-voltage well region having a first conductivity type. The method further includes forming a pair of drain drift regions in the high-voltage well region. The pair of drain drift regions are on the front side of the substrate, and the pair of drain drift regions have a second conductivity type opposite to the first conductivity type. The method further includes forming a gate electrode embedded in the high-voltage well region. The gate electrode is positioned between the pair of drain drift regions and laterally spaced apart from the pair of drain drift regions.

19 Claims, 10 Drawing Sheets

(56) References Cited

U.S. PATENT DOCUMENTS

2018/0337276 A1* 11/2018 Huang ................ H01L 29/7823

FOREIGN PATENT DOCUMENTS

| TW | 201320335 A1 | 3/2013 |
| TW | 201320335 A1 | 5/2013 |
| TW | 201533905 A | 9/2015 |
| TW | 201735264 A | 10/2017 |

* cited by examiner

SEMICONDUCTOR STRUCTURE HAVING A HIGH VOLTAGE WELL REGION

BACKGROUND

Technical Field

The disclosure relates to a semiconductor structure and more particularly to a semiconductor structure with a gate electrode embedded in the substrate.

Description of the Related Art

High voltage (HV) semiconductor devices are widely applied in high-voltage and high-power ICs. Conventional high-voltage semiconductor devices include double-diffused drain metal oxide semiconductors (DDMOS), lateral diffused metal oxide semiconductors (LDMOS), and extended-diffused metal oxide semiconductors (EDMOS). The high-voltage semiconductor devices are compatible with conventional CMOS fabrication processes and therefore are cost effective. For this reason, high-voltage semiconductor devices are widely used in such fields as power supply, power management, display driver IC, communication, automotive electronics, and industrial control.

With advances in technology, the semiconductor industry continues to scale down the dimensions of semiconductor devices, and the demand for simple yet effective devices is ever-increasing. For HV devices, except for being cost effective, the drain-to-source ON resistance (Rdson) may also drop while the device becomes smaller. However, the breakdown voltage may degrade as a result.

Therefore, although existing HV devices have generally been adequate for their intended purposes, they have not been entirely satisfactory in all respects and need to be improved, especially with respect to those smaller HV devices.

BRIEF SUMMARY

The present disclosure provides a method for fabricating a semiconductor structure. The method for fabricating a semiconductor structure includes providing a substrate. The method for fabricating a semiconductor structure further includes implanting the substrate to form a high-voltage well (HVW) region having a first conductivity type. The method for fabricating a semiconductor structure further includes forming a pair of drain drift regions in the high-voltage well region. The pair of drain drift regions are on the front of the substrate, and the pair of drain drift regions have a second conductivity type opposite to the first conductivity type. The method for fabricating a semiconductor structure further includes forming a gate electrode embedded in the high-voltage well region. The gate electrode is positioned between the pair of drain drift regions and laterally spaced apart from the pair of drain drift regions.

The present disclosure also provides a semiconductor structure. The semiconductor structure includes a substrate. The semiconductor structure further includes a high-voltage well (HVW) region having a first conductivity type. The semiconductor structure further includes a pair of drain drift regions disposed in the high-voltage well region. The pair of drain drift regions are on the front side of the substrate, and the pair of drain drift regions have a second conductivity type opposite to the first conductivity type. The semiconductor structure further includes a gate trench between the pair of drain drift regions. The semiconductor structure further includes a gate electrode embedded in the high-voltage well region. The gate electrode is positioned between the pair of drain drift regions and laterally spaced apart from the pair of drain drift regions.

A detailed description is given in the following embodiments with reference to the accompanying drawings.

BRIEF DESCRIPTION OF DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
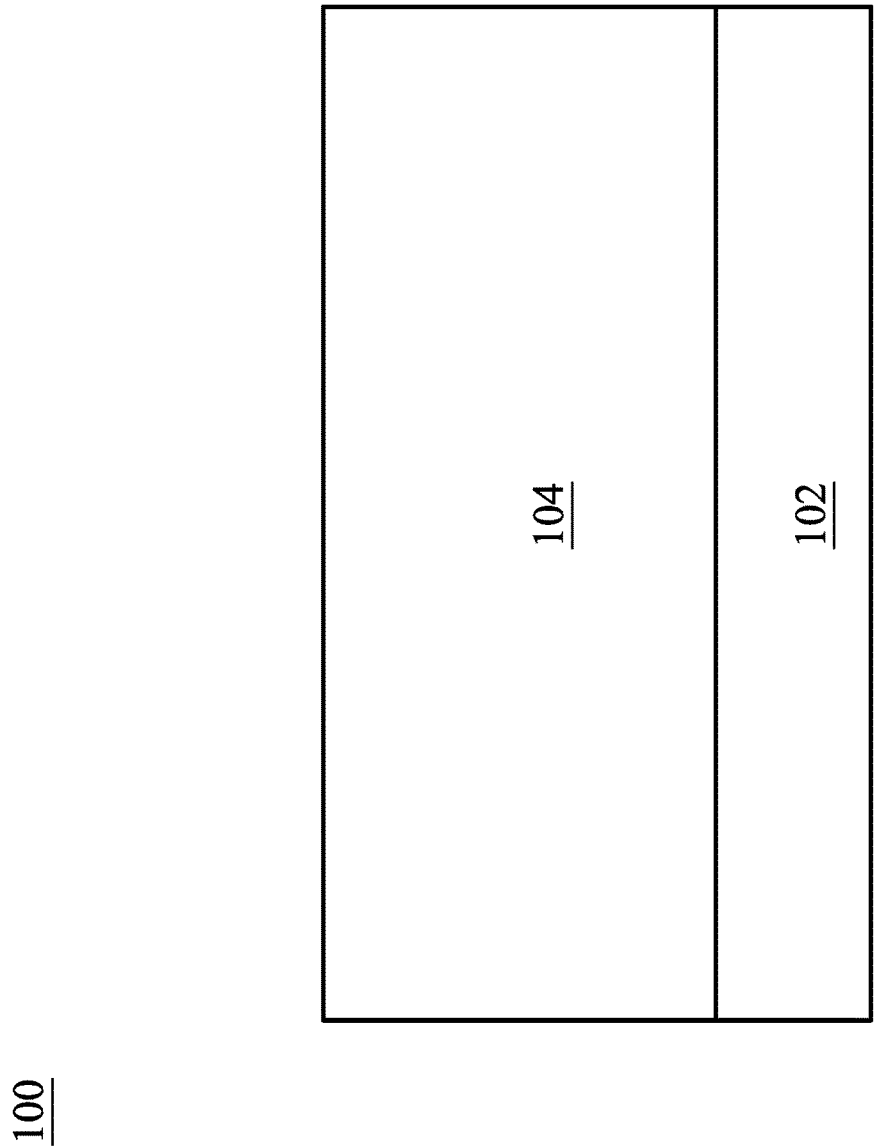
FIGS. 1-7 are cross-sectional representations of various stages of forming a semiconductor structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Herein, the terms "around," "about," "substantial" usually mean within 20% of a given value or range, preferably within 10%, and better within 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

The embodiments of the present disclosure provide a high voltage device with a gate electrode embedded in the substrate. The embedded gate allows the HV devices to be miniaturized to reduce the Rdson without compromising the breakdown voltage and the threshold voltage. The manufacturing of the embedded gate electrode is compatible with conventional processes and is applicable to various high-voltage (HV) devices such as DDMOS, LDMOS, and EDMOS.

FIGS. 1 to 7 are cross-sectional representations of various stages of forming the semiconductor structure 100 in accordance with some embodiments of the present disclosure. As shown in FIG. 1 according to some embodiments, a substrate 102 is provided. The substrate 102 may be a semiconductor substrate such as a Si substrate. Moreover, the semiconductor substrate may also include other elementary semiconductors such as Ge; compound semiconductors such as GaN, SiC, GaAs, GaP, InP, InAs, and/or InSb; alloy semiconductors such as SiGe, GaAsP, AlInAs, AlGaAs, GaInAs, GaInP, and/or GaInAsP, or a combination thereof. The substrate 102 may be a single layer substrate or a multi-layer substrate. In addition, the substrate 102 may also be semiconductor on insulator (SOI). The SOI substrate may be fabricated using a wafer bonding process, a silicon film transfer process, a separation by implantation of oxygen (SIMOX) process, another applicable method, or a combination thereof. In some embodiments, the substrate 102 has a first conductivity type. In some other embodiments, the substrate 102 has a second conductivity type. The second conductivity type is opposite to the first conductivity type. In some embodiments, the first conductivity type is P-type. For example, the substrate 102 may be a boron-doped substrate. In some other embodiments, the first conductivity type is N-type. For example, the substrate 102 may be a phosphorous-doped or arsenic-doped substrate.

In some embodiments, isolation features (not shown) are formed in the semiconductor substrate 102. The isolation features are used to define active regions and electrically isolate various device elements formed in and/or over the semiconductor substrate 102 in the active regions. In some embodiments, the isolation features include shallow trench isolation (STI) features, local oxidation of silicon (LOCOS) features, other suitable isolation features, or a combination thereof. In some embodiments, the isolation features are filled with dielectric materials such as silicon oxide or silicon nitride. The isolation features may be formed by sequentially forming an insulating layer on the substrate 102; selectively etching the insulating layer and the substrate 102 to form a trench in the substrate 102; growing a liner rich in nitrogen (e.g., silicon oxynitride) on the bottom and the sidewalls of the trench; filling a gap fill material (e.g., silicon dioxide or borophosphosilicate glass (BPSG)) in the trench by a deposition processes such as chemical vapor deposition (CVD); applying an anneal process to the gap fill material; and planarizing (by a planarization process such as chemical mechanical polishing (CMP)) the substrate 102 to remove the excess gap fill layer so that the gap fill material in the trench is level with the top surface of the substrate 102. It should be noted that the above processes are merely examples, and hence the invention should not be limited to them.

Next, a first conductivity type dopant is implanted in the substrate 102 to form the high-voltage well regions 104. The first conductivity type may be P-type dopant such as B, Ga, Al, In, $BF_3^+$ ions, or a combination thereof. Alternatively, the first conductivity type may N-type dopant may such as P, As, N, Sb ions, or a combination thereof. The dopant concentration of the high-voltage well regions 104 is in a range of around $1e14/cm^3$ to $1e17/cm^3$. In some embodiments, the high-voltage well region 104 may be formed by implanting the substrate 102 through a patterned mask (not shown) such as a patterned photoresist. In some other embodiments, the patterned mask is a hard mask.

Figure 2:
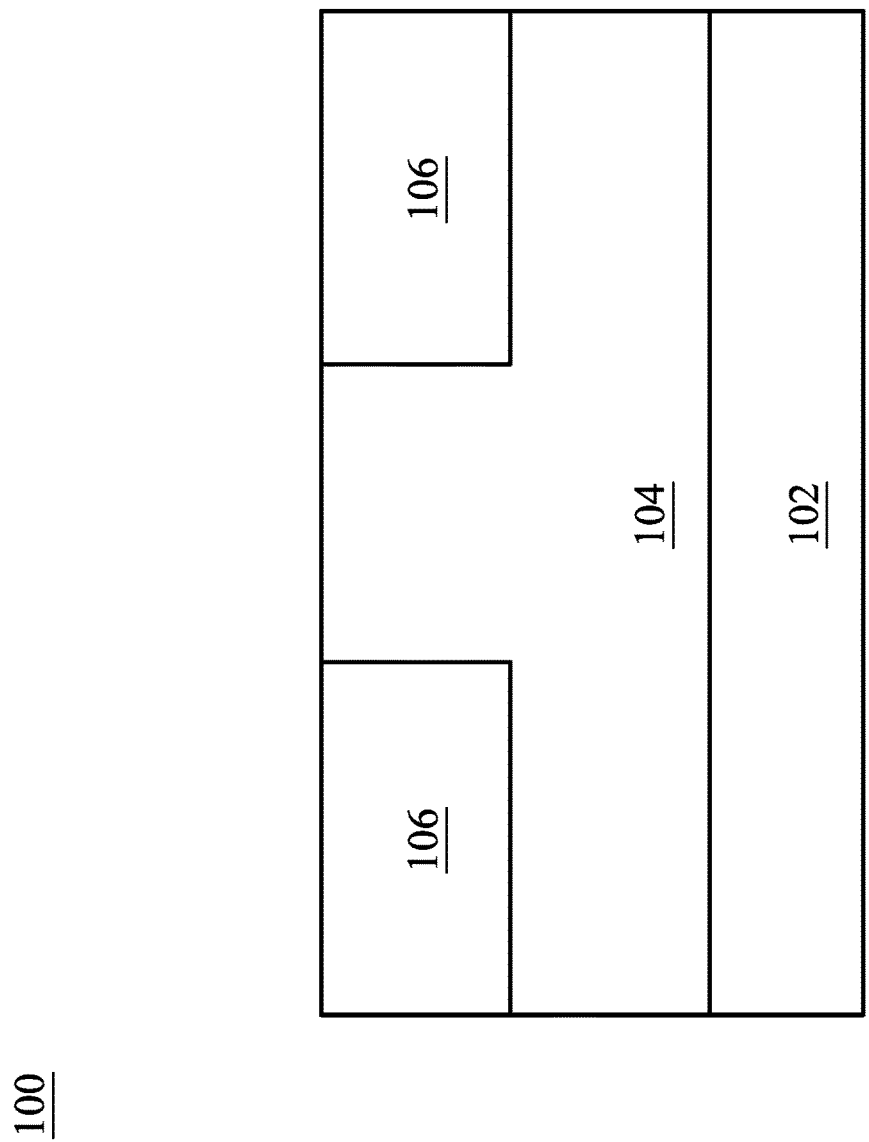

Next, as shown in FIG. 2 according to some embodiments, a pair of drain drift regions 106 are formed on a front side (or the active side) of the substrate 102. In some embodiments, the pair of drain drift regions 106 have a second conductivity type. The dopant concentration of the pair of drain drift regions 106 is in a range of around $5e14/cm^3$ to $1e17/cm^3$. The pair of drain drift regions 106 may be implanted through a patterned mask (not shown) having openings that expose the areas to be implanted. The pair of drain drift regions 106 may help to sustain high breakdown voltage for HV devices.

Figure 3:
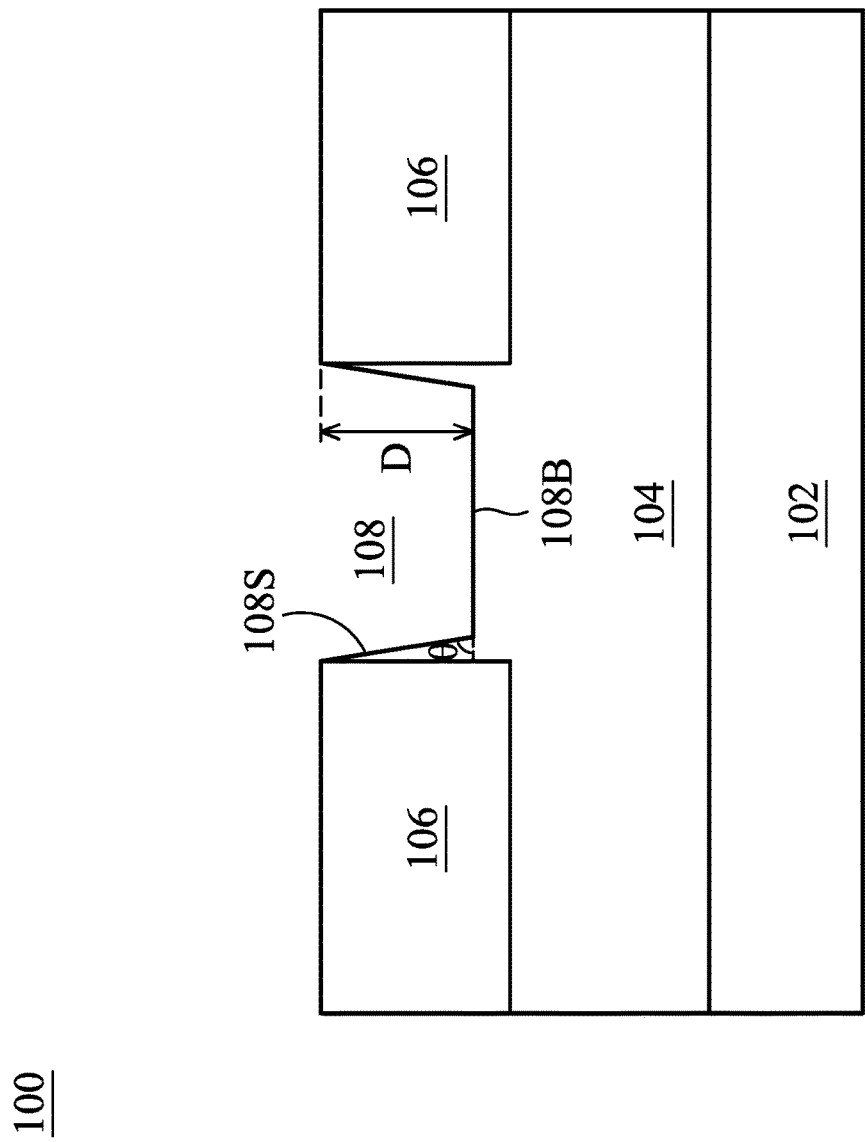

Next, as shown in FIG. 3 according to some embodiments, a gate trench 108 is formed in the substrate between the pair of drain drift regions 106. In some embodiments, the gate trench 108 is formed by photolithography and etching process. The photolithography process may include photoresist coating (e.g., spin-on coating), soft baking, mask aligning, pattern exposure, post-exposure baking, photoresist development, and rinsing and drying (e.g., hard baking), etc. The etching process may include a dry etching process (e.g., reactive ion etching (RIE), anisotropic plasma etching method), a wet etching process, or a combination thereof. The depth D of the gate trench 108 shown in FIG. 3 is between 0.25 μm and 0.75 μm. If the depth D is too shallow, it may be difficult to keep the same breakdown voltage and threshold voltage as general planar devices with channel approximately on the same geometric plane under the gate. On the other hand, if the depth D is too deep, the step coverage of the subsequent process may be poor.

As shown in FIG. 3, the gate trench 108 tapers towards the bottom surface 108B of the gate trench 108. In some embodiments, the included angle θ between a sidewall surface 108S and the bottom surface 108B of the gate trench 108 is between 55 degrees and 85 degrees. If the angle θ is too steep, the step coverage of subsequent process may be poor. If the angle is too gentle, it may be hard to keep the same breakdown voltage and threshold voltage as planar devices.

As shown in FIG. 3, the top edges of the gate trench 108 adjoin the sidewalls of the pair of drain drift regions 106. That is, the top edges of the gate trench 108 substantially align with the sidewalls of the pair of drain drift regions 106. If the top edges of the gate trench 108 are spaced apart from the sidewalls of the pair of drain drift regions 106, it may enlarge the device size and Rdson may increase. If the top edges of the gate trench 108 overlap the sidewalls of the pair of drain drift regions 106, it may not be able to sustain a high breakdown voltage.

It is noted that the shape of the gate trench 108 is not particularly limited. It may be any shape such as inverted trapezoidal, U-shape, rectangle, and so on, depending on the design requirements.

Figure 4:
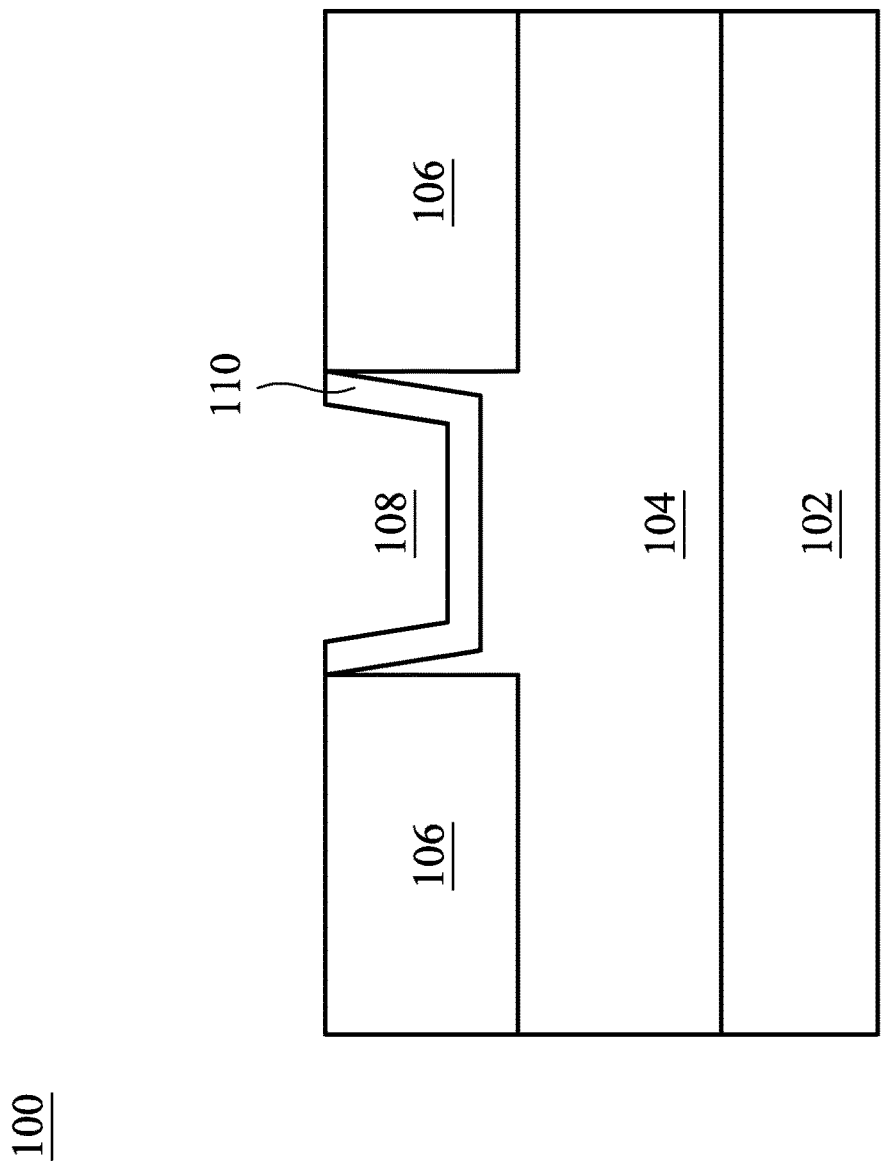

Next, as shown in FIG. 4, an insulating layer 110 may be conformally formed on the bottom and the sidewalls of the gate trench 108. The insulating layer 110 may be a gate dielectric layer. The insulating layer 110 may include silicon oxide. The silicon oxide may be formed by an oxidation process (e.g., a dry oxidation process, or a wet oxidation process), deposition process (e.g., a chemical vapor deposition process), other applicable processes, or a combination thereof. In some embodiments, the insulating layer 110 may be thermal grown by a thermal oxidation process in oxygen-containing ambient or nitrogen-containing ambient (e.g., NO or $N_2O$) or by a UV-ozone oxidation. Alternatively, the insulating layer 110 may include a high-k dielectric layer (e.g., the dielectric constant is greater than 3.9) such as hafnium oxide (HfO$_2$). Alternatively, the high-k dielectric layer may include other high-k dielectrics such as LaO, AlO, ZrO, TiO, Ta$_2$O$_5$, Y$_2$O$_3$, SrTiO$_3$, BaTiO$_3$, BaZrO, HfZrO, HfLaO, HfTaO, HfSiO, HfSiON, HfSiO, LaSiO, AlSiO, BaTiO$_3$, SrTiO$_3$, Al$_2$O$_3$, other applicable high-k dielectric materials, or a combination thereof. The high-k dielectric layer may be formed by a chemical vapor deposition process (CVD) (e.g., a plasma enhanced chemical vapor deposition (PECVD) process, a metalorganic chemical vapor deposition (MOCVD) process, or a high density plasma chemical vapor deposition (HDPCVD)), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof. The thickness of the insulating layer 110 is between 110 Å and 700 Å.

Figure 5:
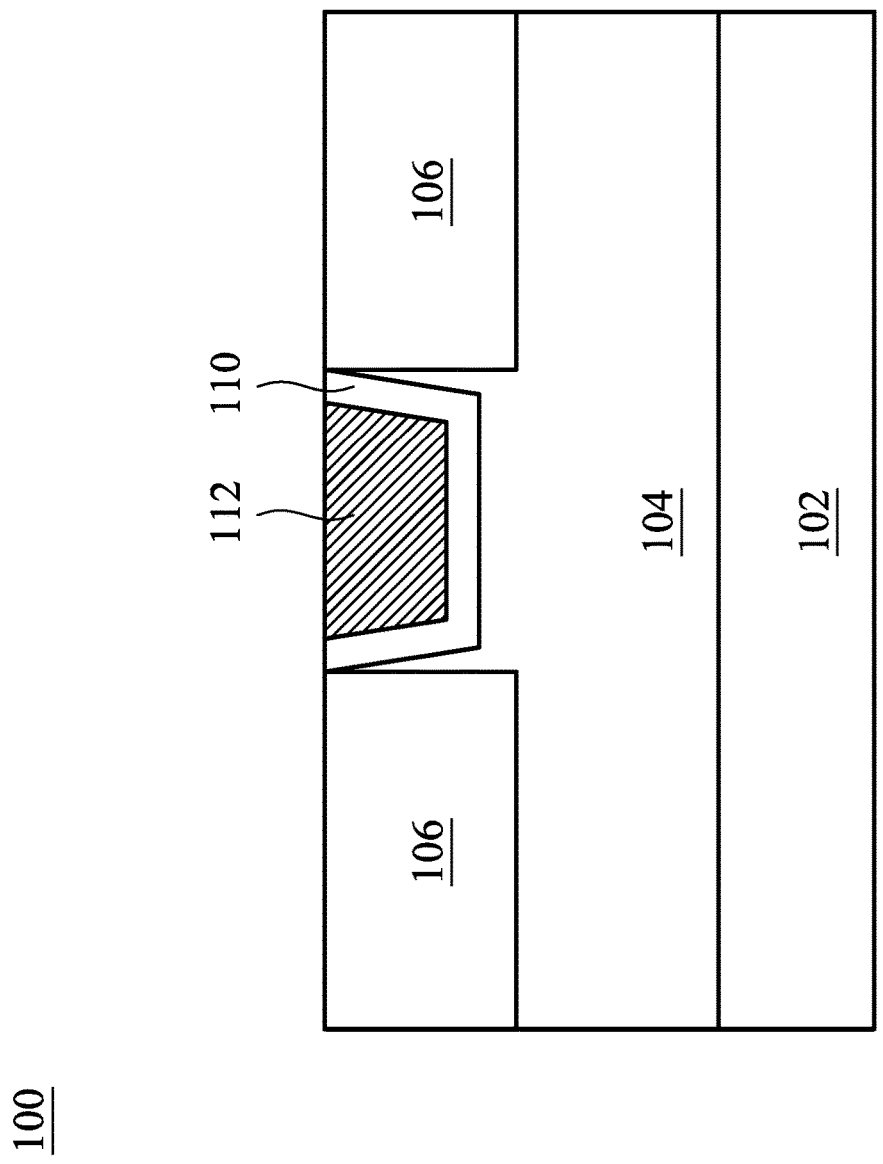

Next, as shown in FIG. 5, a gate electrode 112 is formed in the gate trench 108. As a result, the gate electrode 112 is embedded in the high-voltage well region 104 between the pair of drain drift regions 106. The gate electrode 112 may include polycrystalline-silicon (poly-Si), poly-crystalline silicon-germanium (poly-SiGe), metals (e.g., tungsten, titanium, aluminum, copper, molybdenum, nickel, platinum, the like, or a combination thereof), metal alloys, metal-nitrides (e.g., tungsten nitride, molybdenum nitride, titanium nitride, and tantalum nitride, the like, or a combination thereof), metal-silicides (e.g., tungsten silicide, titanium silicide, cobalt silicide, nickel silicide, platinum silicide, erbium silicide, the like, or a combination thereof), metal-oxides (e.g., ruthenium oxide, indium tin oxide, the like, or a combination thereof), other applicable materials, or a combination thereof. In some embodiments, the gate electrode 112 is a single layer of gate electrode material. In some other embodiments, the gate electrode 112 may be multilayer stack including more than two layers of gate electrode material. The gate electrode 112 may be formed by a chemical vapor deposition (CVD) process (e.g., a low pressure chemical vapor deposition process (LPCVD), or a plasma enhanced chemical vapor deposition process (PECVD)), a physical vapor deposition (PVD) process (e.g., a vacuum evaporation process, or a sputtering process), other applicable processes, or a combination thereof. After the deposition, a chemical mechanical polishing (CMP) process or an etching back process may be optionally performed to remove the excess gate electrode material. In some embodiments, the gate electrode 112 is laterally spaced apart from the pair of drain drift regions 106. If the gate electrode 112 is too close to the pair of drain drift regions 106, it may not be able to sustain a high breakdown voltage.

As shown in FIG. 5 in some embodiments, the top surface of the gate electrode 112 is coplanar with the top surface of the substrate 102. In some other cases, the gate electrode 112 may overfill the gate trench 108 and protrude out of the top surface of the substrate 102.

It should be noted that the order in which the drain drift regions 106 and the gate electrode 112 are formed may be reversed. In some embodiments, the pair of drain drift regions 106 are formed prior to the gate electrode 106. In other embodiments, the gate electrode 106 is formed prior to the pair of drain drift regions 106.

Figure 6:
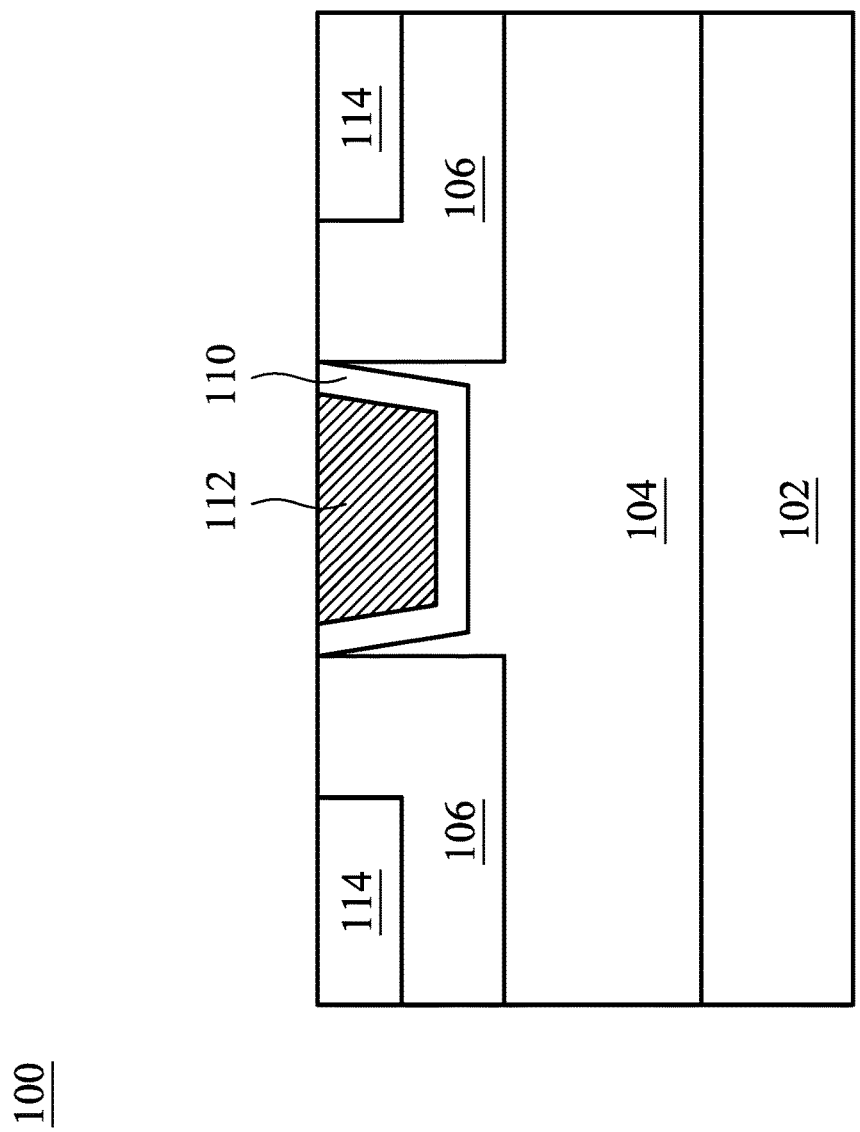

Next, as shown in FIG. 6, source/drain regions 114 are formed within the pair of drain drift regions 106. In some embodiments, the source/drain regions 114 have a second conductivity type. Compared to the pair of drain drift regions 106, the source/drain regions 114 are shallower and are farther from the gate structure. The dopant concentration of the source/drain regions 114 is in a range of around 5e17/cm$^3$ to 5e20/cm$^3$. In some embodiments, the pair of drain drift regions 106 are implanted with a patterned mask (not shown).

Figure 7:
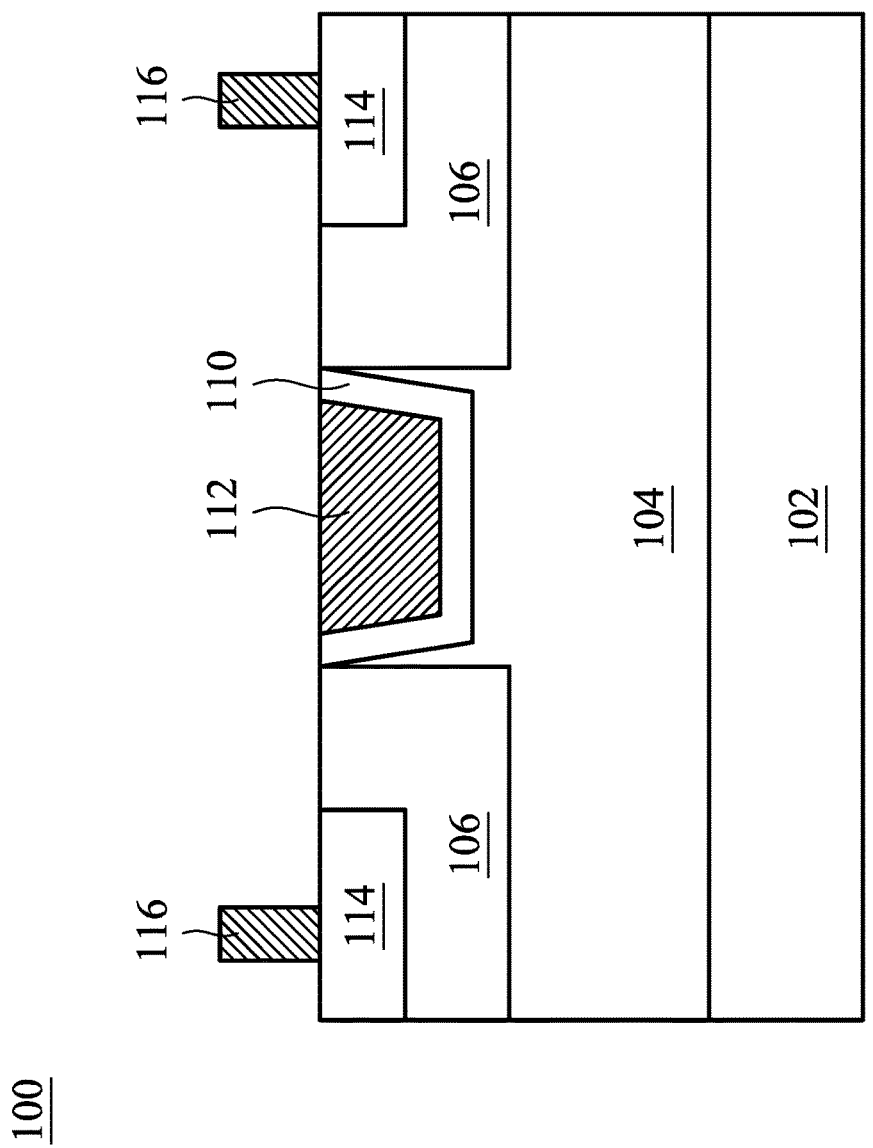

Next, as shown in FIG. 7, the contact 116 is formed on the source/drain regions 114. In some embodiments, the contact 116 may include Ti, Al, Au, Pd, Cu, W, other suitable metal, metal alloys, poly-Si, other applicable conductive materials, or a combination thereof. In some embodiments, the contact material is formed on source/drain regions 114 first by chemical vapor deposition (CVD), physical vapor deposition (PVD) (e.g., resistive heating evaporation or sputtering), electroplating, atomic layer deposition (ALD), another suitable method, or a combination thereof. The electrode material is then patterned by a photolithography and an etching process to form the contact 116. A chemical mechanical polishing (CMP) process or an etching back process is then optionally performed to remove excess conductive materials.

Compared to planar devices, the gate electrode 112 in the present disclosure is embedded in the high-voltage well region 104. As a result, the effective channel length may keep the same while the device size is reduced. Therefore, the breakdown voltage and the threshold voltage may keep the same with an embedded gate electrode 112. Since the device size is reduced, the distance between the source and drain regions 114 is also reduced. Therefore, the drain-to-source ON resistance (Rdson) may also decrease. In some embodiments, the Rdson of HV devices with an embedded gate electrode 112 may lessen by more than 25% compared to that of planar HV devices. Moreover, the overall die size may also shrink as the device size gets smaller.

The process of the embodiments of the present disclosure is compatible with existing HV processes. In some embodiments, only one extra patterned mask is needed to form the gate trench 108 such that significant revamping of semiconductor capital equipment is not required.

Figure 8:
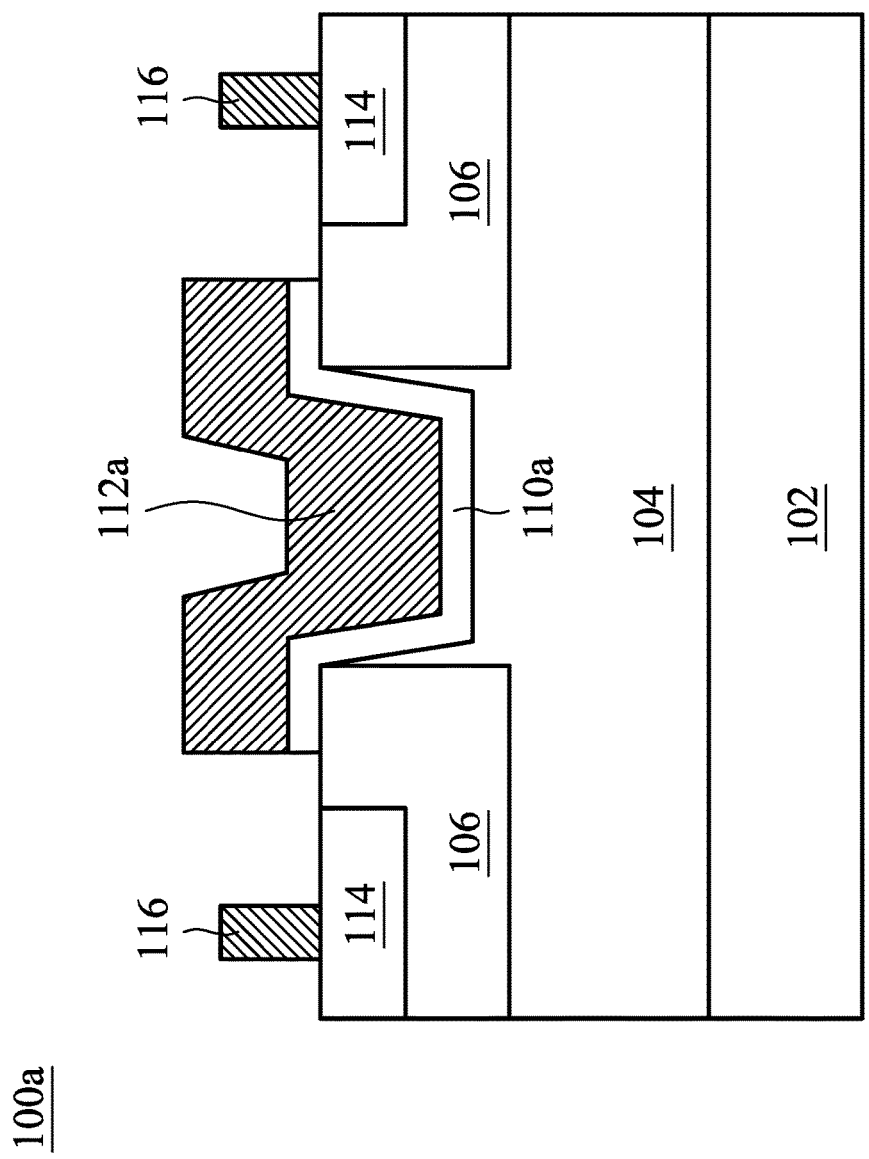
FIG. 8 is a cross-sectional representation of a semiconductor structure in accordance with some embodiments.

Many variations and/or modifications may be made to the embodiments of the disclosure. FIG. 8 is a cross-sectional representation of a semiconductor structure 100a in accordance with some alternative embodiments. Unless otherwise specified, the materials and formation methods of the components in these embodiments are essentially the same as the embodiments shown in FIG. 1-7. The same reference numerals are generally used to refer to corresponding or similar features in modified or different embodiments. As shown in FIG. 8, the gate electrode 112a and the insulating layer 110a extend out of the gate trench 108 and cover a part of the pair of drain drift regions 106. The processes and materials used in forming the semiconductor structure 100a may be similar to, or the same as, those used to form the semiconductor structure 100 and are not repeated herein.

As shown in FIG. 8 according to some embodiments, the gate electrode 112a and the insulating layer 110a extend out of the gate trench and cover a part of the pair of drain drift regions 106. Since the gate area increases, the gate resistance may decrease as the gate electrode 112a and the insulating layer 110a extend out of the gate trench 108.

Figure 9:
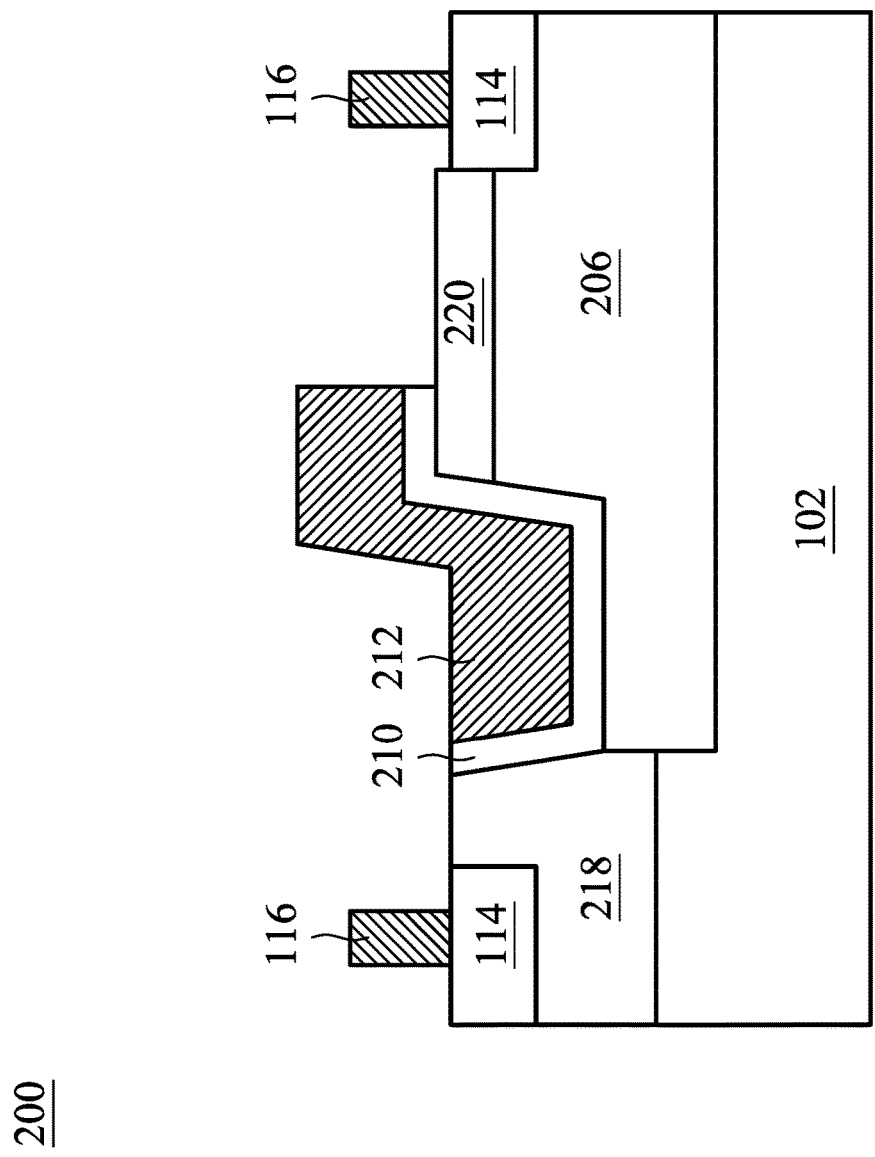
FIG. 9 is a cross-sectional representation of a semiconductor structure in accordance with some embodiments.

The embedded gate of the disclosure is also applicable to other HV devices such as lateral diffused MOSFET (LDMOS). FIG. 9 is a cross-sectional representation of a semiconductor structure 200 in accordance with some embodiments relating to LDMOS.

As shown in FIG. 9 according to some embodiments, the semiconductor structure 200 includes a substrate 102 having either a first or second conductivity type, a drift region 206 having a second conductivity type, a body region 218 having a first conductivity type, an embedded gate structure including an insulating layer 210 and a gate electrode 212. The embedded gate structure is embedded in the body region 218 and drift region 206. The semiconductor structure 200 further includes source/drain regions 114 having the second conductivity type disposed on the opposite sides of the gate structure. The contact 116 is formed on the source/drain regions 114. An isolation region 220 is disposed on the drift region 206 between the drain region 114 and the gate structure. Moreover, the embedded gate electrode 212 extends out of the gate trench and covers a part of the isolation region 220. Materials and processes used to form the semiconductor structure 200 may be similar to, or the same as, those used to form the semiconductor structure 100 described previously and are not repeated herein for brevity.

Since the gate electrode 212 is embedded the body region 218 and drift region 206, the effective channel length may keep the same while the device size is reduced. Therefore, the breakdown voltage and the threshold voltage may keep the same with an embedded gate electrode 212. Since the device size is reduced, the distance between the source and drain regions 114 is reduced. Therefore, the drain-to-source ON resistance (Rdson) may also drop. In some embodiments, the Rdson of HV devices with an embedded gate electrode 212 may lessen by more than 25% compared to that of planar HV devices. Moreover, the overall die size may also shrink as the device size gets smaller.

Figure 10:
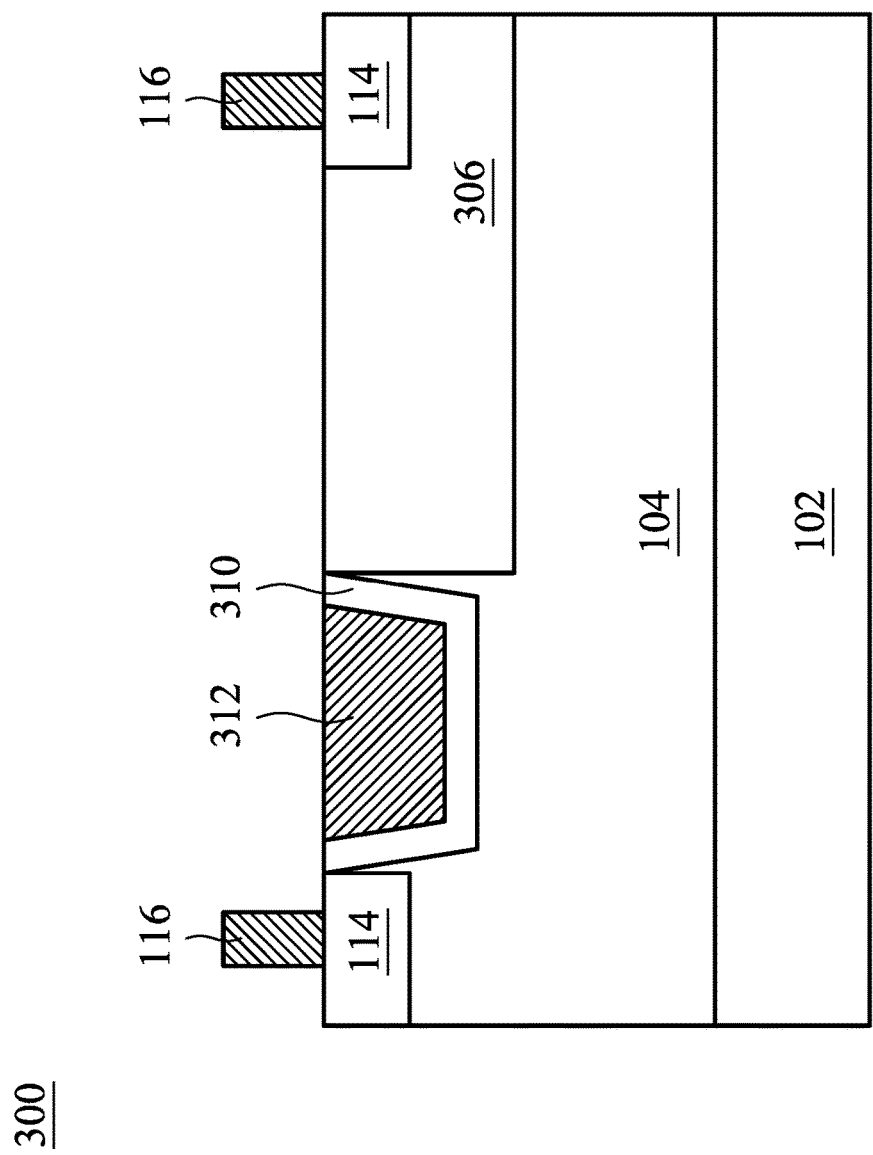
FIG. 10 is a cross-sectional representation of a semiconductor structure in accordance with some embodiments.

FIG. 10 is a cross-sectional representation of a semiconductor structure 300 in accordance with some embodiments relating to extended drain MOSFET (EDMOS). The semiconductor structure 300 is an EDMOS similar to the semiconductor structure 100, except that there is only one drift region on one side of the trench gate.

As shown in FIG. 10 according to some embodiments, the semiconductor structure 300 includes a substrate 102 having either a first or second conductivity type, a high voltage well region 104 having the first conductivity type, a drift region 306 with a second conductivity type, an embedded gate structure including an insulating layer 310 and gate electrode 312. The semiconductor structure 300 further includes source/drain regions 114 having the second conductivity type disposed on the opposite sides of the gate structure. On one side (left in the embodiments of FIG. 10), the top edge of the gate trench adjoins the sidewall of one of the source/drain regions 114. On the other side (right in the embodiments of FIG. 10), the top edge of the gate trench adjoins the sidewall of the drift region 306. The contact 116 is formed on the source/drain regions 114. Descriptions of these processes and devices are not repeated herein for brevity.

Since the gate electrode 312 is embedded in the high voltage well region 104, the effective channel length may keep the same while the device size is reduced. Therefore, the breakdown voltage and the threshold voltage may keep the same with an embedded gate electrode 312. Since the device size is reduced, the distance between the source and drain regions is also reduced. Therefore, the drain-to-source ON resistance (Rdson) may also lessen. In some embodiments, the Rdson of HV devices with an embedded gate electrode 312 may drop by more than 25% compared to that of planar HV devices. Moreover, the overall die size may also shrink as the device size gets smaller.

Accordingly, the embedded gate structure disclosed herein is widely applicable to numerous HV devices, such as EDMOS, DDMOS, and LDMOS. The EDMOS with a drain drift region on the drain side may help to reduce the hot carrier effect and help to improve reliability. The DDMOS with drain drift regions on both source and drain sides are more reliable. The LDMOS can sustain higher voltage so that the operation voltage may be higher.

As mentioned above, in the present disclosure the gate electrode is embedded in the substrate for HV devices. As the effective gate length increases, the breakdown voltage and threshold voltage may keep the same while the device size is reduced. Since the device size is reduced, the Rdson may also drop by more than 25%. Meanwhile, the overall die size may also shrink as the device size gets smaller. The embedded gate process is compatible with convention HV processes, and only one extra mask is needed to form the gate trench. The embedded is applicable to different HV devices such as DDMOS, LDMOS, and EDMOS.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor structure, comprising:
   providing a substrate;
   implanting the substrate to form a high-voltage well (HVW) region having a first conductivity type;
   forming a pair of drain drift regions in the high-voltage well region, wherein the pair of drain drift regions are on a front side of the substrate, and the pair of drain drift regions have a second conductivity type opposite to the first conductivity type;
   etching the substrate between the pair of drain drift regions to form a gate trench, wherein the gate trench has a bottom and sidewalls connecting to the bottom, and the bottom of the gate trench is laterally spaced apart from the pair of drain drift regions; and
   forming a gate electrode embedded in the high-voltage well region, wherein the gate electrode is positioned between the pair of drain drift regions and laterally spaced apart from the pair of drain drift regions.

2. The method for fabricating a semiconductor structure as claimed in claim 1, wherein a top surface of the gate electrode is coplanar with a top surface of the substrate.

3. The method for fabricating a semiconductor structure as claimed in claim 1, wherein the gate electrode is formed prior to the formation of the pair of drain drift regions.

4. The method for fabricating a semiconductor structure as claimed in claim 1, wherein the pair of drain drift regions are formed prior to the formation of the gate electrode.

5. The method for fabricating a semiconductor structure as claimed in claim 1, wherein top edges of the gate trench adjoin sidewalls of the pair of drain drift regions.

6. The method for fabricating a semiconductor structure as claimed in claim 1, wherein the gate electrode extends out of the gate trench and covers a part of the pair of drain drift regions.

7. The method for fabricating a semiconductor structure as claimed in claim 1, wherein the gate trench tapers towards a bottom surface of the gate trench.

8. The method for fabricating a semiconductor structure as claimed in claim 1, wherein an included angle between a sidewall surface and a bottom surface of the gate trench is between 55 degrees and 85 degrees.

9. The method for fabricating a semiconductor structure as claimed in claim 1, wherein a depth of the gate trench is between 0.25 μm and 0.75 μm.

10. The method for fabricating a semiconductor structure as claimed in claim 1, further comprising:
conformally forming an insulating layer on the bottom and the sidewalls of the gate trench.

11. The method for fabricating a semiconductor structure as claimed in claim 10, wherein the insulating layer is formed by oxidation.

12. The method for fabricating a semiconductor structure as claimed in claim 10, wherein the insulating layer has a thickness of between 110 Å and 700 Å.

13. The method for fabricating a semiconductor structure as claimed in claim 1, further comprising:
implanting the substrate to form source/drain regions in the pair of drain drift regions, wherein the source/drain regions are on the front side of the substrate, and the source/drain regions have the second conductivity type; and
forming a contact on the source/drain regions.

14. A semiconductor structure, comprising:
a substrate;
a high-voltage well (HVW) region having a first conductivity type;
a pair of drain drift regions disposed in the high-voltage well region, wherein the pair of drain drift regions are on a front side of the substrate, and the pair of drain drift regions have a second conductivity type opposite to the first conductivity type;
a gate trench between the pair of drain drift regions, wherein the gate trench has a bottom and sidewalls connecting to the bottom, and the bottom of the gate trench is laterally spaced apart from the pair of drain drift regions; and
a gate electrode embedded in the high-voltage well region, wherein the gate electrode is positioned between the pair of drain drift regions and laterally spaced apart from the pair of drain drift regions.

15. The semiconductor structure as claimed in claim 14, wherein a top surface of the gate electrode is coplanar with a top surface of the substrate.

16. The semiconductor structure as claimed in claim 14, wherein top edges of the gate trench adjoin sidewalls of the pair of drain drift regions.

17. The semiconductor structure as claimed in claim 14, wherein the gate trench tapers towards a bottom surface of the gate trench.

18. The semiconductor structure as claimed in claim 14, further comprising:
an insulating layer conformally disposed on the bottom and the sidewalls of the gate trench.

19. The semiconductor structure as claimed in claim 14, further comprising:
source/drain regions in the pair of drain drift regions, wherein the source/drain regions have the second conductivity type; and
a contact on the source/drain regions.

\* \* \* \* \*